United States Patent [19]

Smyth, Jr. et al.

[11] Patent Number: 5,066,357
[45] Date of Patent: Nov. 19, 1991

[54] METHOD FOR MAKING FLEXIBLE CIRCUIT CARD WITH LASER-CONTOURED VIAS AND MACHINED CAPACITORS

[75] Inventors: John B. Smyth, Jr.; Ellen R. Tappon, both of Corvallis, Oreg.

[73] Assignee: Hewlett-Packard Company, Palo Alto, Calif.

[21] Appl. No.: 463,695

[22] Filed: Jan. 11, 1990

[51] Int. Cl.⁵ .................. B44C 1/22; B29C 37/00
[52] U.S. Cl. .................. 156/643; 156/644; 156/651; 156/655; 156/668; 156/902; 219/121.69; 219/121.71; 219/121.8
[58] Field of Search .............. 156/643, 644, 646, 651, 156/655, 668, 902; 131/1; 204/192.36; 427/53.1, 96; 250/492.1, 492.3; 219/121.65, 121.66, 121.68, 121.69, 121.7, 121.71, 121.8, 121.84

[56] References Cited

U.S. PATENT DOCUMENTS

| | | | |
|---|---|---|---|
| 4,545,852 | 10/1985 | Barton | 156/643 |
| 4,642,160 | 2/1987 | Burgess | 156/630 |
| 4,714,516 | 12/1987 | Eichelberger | 156/628 |
| 4,894,115 | 1/1990 | Eichelberger | 156/643 |
| 4,897,153 | 1/1990 | Cole et al. | 156/643 |
| 4,915,981 | 4/1990 | Traskos et al. | 427/53.1 |

FOREIGN PATENT DOCUMENTS

0227903A2  7/1987  European Pat. Off.  .............. 21/268

OTHER PUBLICATIONS

Rainer et al., F., "Review of UV laser damage measurements at Lawrence Livermore National Laboratory", SPIE, vol. 710, Excimer Laser and Optics, 1986, pp. 74-84.
Scott, M. L., "A Review of UV Coating Material Properties," DARPA 1984 Research Reports, Chemical Abstracts Service, pp. 329-339.
Foltyn et al., S. R., "Alumina/Silica Multilayer Coatings for Excimer Lasers," DARPA 1984 Research Reports, Chemical Abstracts Service, pp. 354-359.
Wani et al., K., "Narrow-band KrF excimer laser—tunable and wavelength stabilized," SPIE, vol. 998, Excimer Beam Applications, 1988, pp. 1-8.
Harte et al., K. J., "Excimer laser light delivery system for micromachining," SPIE, vol. 998, Excimer Beam Applications, 1988, pp. 9-12.
Hagerhorst et al., J. M., "Focussed Excimer Laser Beams: A Technique for Selective Micropatterning," SPIE, vol. 998, Excimer Beam Applications, 1988, pp. 105-112.
IBM Technical Disclosure Bulletin, vol. 10, No. 10, Mar. 1968, pp. 166-167, "Film Supported Probe for the AC Pulse Testing of Integrated Circuits".
IBM Technical Disclosure Bulletin, vol. 13, No. 5, Oct. 1970, pp. 1263-1264, "Membrane Type Probe".
IBM Technical Disclosure Bulletin, vol. 15, No. 5, Oct. 1972, p. 1513, "Flexible Contact Probe".
International Test Conference IEEE Proceedings, 1988, pp. 608-614, "Very High Density Probing", C. Barsotti et al.

(List continued on next page.)

Primary Examiner—William A. Powell

[57] ABSTRACT

A flexible circuit such as a membrane probe (10) is made by forming a trench (50, 60) in the upper surface (39) of a polyimide substrate (38) with a trench base (52, 62) spaced below the upper surface. The trench has an end wall (54, 64) ramped at an obtuse angle to the substrate upper surface and the trench base. A conductive layer deposited on the upper surface is patterned to form a line trace (44, 46) extending continuously over the substrate upper surface, down the ramped end wall and along the trench base, to contact a ground plane or form a distributed capacitance. An excimer laser is used, at a wavelength of 308 nm., an energy density less than 0.54 J./cm² (preferably 0.18 to 0.35 J./cm²), and a pulse frequency of about 100 Hz., to ablate successive incremental thicknesses (80) of polyimide from the substrate in sweeps of depthwise decreasing length.

25 Claims, 1 Drawing Sheet

OTHER PUBLICATIONS

International Test Conference, IEEE Proceedings, 1988, pp. 601–607, "Membrane Probe Card Technology", B. Leslie and F. Matta.

IBM Technical Disclosure Bulletin, vol. 29, No. 4, Sep. 1986, pp. 1862–1864, "Polymer Via Profile Control With Laser Etching".

Appl. Phys. Lett., 49 (8), Aug. 25, 1986, pp. 453–455, "Development and Origin of Conical Structures on XeCl Laser Ablated Polymide", Dyer and Sidhu.

J. Appl. Phys., 59(11), Jun. 1986, pp. 38, 61–67, "Excimer Laser Etching of Polymers", V. Srinivasan et al.

J. Appl. Phys., 58(5), Sep. 1, 1985, pp. 2036–3043, "Excimer Laser Etching of Polymide", Brannon et al.

J. Vac. Sci. Technol. A, 3(3), May/Jun. 1985, pp. 746–748, "Ablative Photodecomposition of Polymers", B. Garrison.

SPIE, vol. 998, Excimer Beam Applications (1988), pp. 17–23, "A Versatile Excimer Laser Processing System", G. D. Poulin.

Appl. Phys. Lett., 44 (10), May 15, 1984, pp. 1016–1018, "Intensity-Dependent Photobleaching in Thin Polymer Films by Excimer Laser: Lithographic Implications", J. R. Sheats.

METHOD FOR MAKING FLEXIBLE CIRCUIT CARD WITH LASER-CONTOURED VIAS AND MACHINED CAPACITORS

BACKGROUND OF THE INVENTION

This invention relates generally to flexible circuits such as membrane probe cards and more particularly to the formation of electrical circuit conductors and connections thereon.

Testing integrated circuits at the wafer level is essential for the economic manufacture of these complex devices. By rejecting defective components at an early stage, unnecessary packaging costs are avoided. Also, wafer test data provides early feedback on the overall status of the IC fabrication process so that deviations can be quickly detected and corrected. VLSI technology places new demands on wafer test hardware as the technology increases in level of integration and operating speeds. A critical component limiting the performance of the test system is the wafer probe card.

A conventional probe card comprises a printed circuit board supporting an array of delicate, wire contact-styli which provide an electromechanical interface between a device under test (DUT) and the test electronics system. A major limitation of these probes is that the electrical environment of the interface is poorly controlled. Each wire stylus acts essentially as a lumped parasitic conductance of up to 20 nH. The result is to severely degrade signal fidelity at the DUT for frequencies above 50 MHz due to cross talk and high frequency attenuation. Also, these contact wires are so fragile that they do not maintain positional stability during service, so frequent maintenance and realignment are required for reliable operation. The alignment procedure becomes increasingly difficult with increasing pin count.

A membrane probe has been developed in an attempt to solve some of these problems. One of the earliest descriptions of a flexible probe was published in IBM Technical Disclosure Bulletin, Vol. 10, No. 10, March 1968, pages 166-67, entitled, "Film Supported Probe for the AC Pulse Testing of Integrated Circuits." This disclosure was elaborated in subsequent IBM Technical Disclosure Bulletins Vol. 13, No. 5, October 1970, pages 1263-64, entitled, "Membrane Type Probe" and Vol. 15, No. 5, October 1972, pages 1513, entitled "Flexible Contact Probe."

In 1988 International Test Conference IEEE Proceedings, pages 608-614, in a paper entitled, "Very High Density Probing," C. Barsotti et al. describe current probe card testing technologies including the use of a thin film hybrid diaphragm of controlled impedance signal, power and ground conductors aligned to traces on a supporting printed circuit board. This article describes present technology as limited to a four mil pitch signal line spacing, which is indicative of the limited permissible variation in width of line traces.

A current state-of-the art membrane probe is disclosed in "Membrane Probe Card Technology" by B. Leslie and F. Matta in 1988 International Test Conference, IEEE Proceedings, pages 601-607. The concept of the membrane probe is illustrated in FIG. 1. A flexible dielectric membrane supports a set of micro strip transmission lines that connect the test electronics to the DUT. Each transmission line is formed by a conductor trace patterned on one side of the dielectric membrane. A thin metal film on the opposite side acts as a common ground plane. The width of the trace is chosen to obtain a desired line impedance to match a particular device technology. Contact to the DUT, such as an individual integrated circuit die in a wafer, is made by an array of micro contact bumps formed at the ends of the transmission lines via holes in the membrane.

The overall structure of a membrane probe is shown in FIG. 2. The membrane of FIG. 1 is mounted on a printed circuit board carrier which interfaces with a test performance board via an appropriate connector. A forced delivery spring mechanism, supported on the carrier, pushes on the back surface of the membrane so as to protrude the contact bumps below the plane of the carrier. In operation, the membrane probe card is mounted on any commonly used prober and the wafers are stepped onto the probe in the same manner as with standard probes. Contact is made by raising the wafer toward the probe with a controlled overdrive. The spring system is designed to produce a uniform contact force over the entire array.

Although the membrane probe has been generally successful, a number of problems have been encountered in its fabrication and use. For efficient fabrication, it is desirable to use a common format or layout for the probe card for different purposes but, at the same time, it would be desirable to be able to customize the membrane probe.

One way that a membrane probe can be customized is to terminate selected transmission lines by shorting to the ground plane. This can be done by laser-drilling a hole through the dielectric membrane material and forming an electrically conductive VIA between the selected transmission line and the ground plane through the hole. The problem in doing this, however, is that it is difficult, particularly using conventional line-of-sight deposition techniques, to form a reliable conductor through such holes.

Various techniques are known for forming VIAs in printed circuit cards. U.S. Pat. No. 4,642,160 discloses a multi-layer printed circuit board manufacturing process. Metallic masks are formed on the surface of a layer of dielectric material, patterned to define VIA openings and irradiated from a laser light source to open VIAs in the dielectric into which an layer of copper is electrolessly deposited. EP Application No. 0 227 903 A2 discloses a method of etching through a metal layer on a metal/polymer layered structure using the technique of ablative photodecomposition (APD). APD relies on the use of ultraviolet laser radiation, which produces photochemical and other effects, as well as thermal effects, to remove irradiated material. The class of laser used for APD is commonly referred to as an excimer laser. IBM Technical Disclosure Bulletin, Vol. 29, No. 6, September 1986, pages 1862-64 describes how profiles of VIA holes in a polymer substrate can be varied from nearly vertical to very much tapered when a metal mask and excimer laser are used. P.E. Dyer et al. address the development and origin of conical structures in XeCl laser ablative polyimide in Appl. Phys. Let., 49 (8), Aug. 25, 1986, pages 453-55. Detailed discussions of ablative composition of polyimide and other polymer films appear in V. Srinivasan et al., "Excimer Laser Etching of Polymers," J.Appl. Phys. 59 (11) June 1986, pages 38, 61-67 and in J.H. Brannon et al., "Excimer Laser Etching of Polyimide," J. Appl. Phys. 58 (5) Sep. 1, 1985, pages 2036-43; B.J. Garrison et al., "Ablative Photodecomposition of Polymers," J. Vac. Sci. Technol. A 3(3) May/June 1985, pages 746-48; and J.R.

Sheats, "Intensity-Dependent Photobleaching in Thin Polymer Films by Excimer Laser: Lithographic Implications," App. Phys. Lett. 44 (10), May 15, 1984, pages 1016–18. A paper by G.D. Poulin et al. entitled, "A Versatile Excimer Laser Processing System," SPIE Vol. 98, Excimer Beam Applications (1988), pages 17–23, describes the general state of the art to date of excimer laser processing of electrical circuitry on a polymer substrate. None of these references appears to suggest solutions to the problems discussed above.

Difficulties also arise in tailoring the transmission line impedance to each test situation. B. Leslie et al. disclose that this can only be done by varying the width of the transmission line trace. This measure is not adequate for all situations. Also, its use makes it harder to fabricate membrane probes with a common basic design. Different transmission line masks are required to vary the widths of the line traces. Varying line width is also inconsistent with obtaining the narrowest practical probe spacing, as is needed with increasingly dense integrated circuitry. It would be preferable to have a way to alter the transmission line impedance without varying line width or, to extend the range of possible impedance varying control, in combination with varying line width.

Accordingly, a need remains for an improved membrane probe card and method of fabrication of membrane probes.

SUMMARY OF THE INVENTION

One object of the invention is to improve flexible circuits such as membrane probes.

A second object is to improve the methods of fabrication of membrane probes and similar flexible circuits.

Another object is to form controlled-impedance transmission lines in flexible circuits with a constant minimum pitch and variable capacitance.

Yet another object is to enable selected transmission line traces on one side of a membrane probe or other flexible circuit to be reliably shorted to a ground plane or other circuit element on the opposite side of the membrane dielectric material.

A further object is to control transmission line impedance other than by varying the width of the line traces and to form through-VIAs in such a way that line-of-sight deposition can be reliably used to form a conductor therethrough.

An additional object is to form structures other than holes in flexible circuit substrates.

One aspect of the invention is a novel method of forming a circuit conductor on an upper surface of a polymer substrate. A trench is formed in the substrate having a base spaced a predetermined distance below the substrate upper surface. The trench is contoured to include at least one lengthwise end wall defining a ramp extending at an obtuse angle between the substrate upper surface and the base of the trench. An upper conductive layer is deposited on the upper surface and patterned to form a line trace including portions extending lengthwise continuously over a portion of the substrate upper surface, down the ramped end wall and along the base of the trench. The trench is preferably formed and contoured by successively removal of incremental thicknesses of polymer material of depthwise decreasing length from a predetermined length and width of the substrate. The incremental thicknesses of material removed are preferably dimensioned so that step-coverage of the conductive layer deposited in the ramp is continuous.

The method is preferably carried out by laser-etching the surface of the substrate. This aspect of the invention includes selecting and operating an excimer laser at a wavelength and energy density such that directing a beam from the laser at an upper surface of the substrate removes by ablation a predetermined incremental thickness of polymer material to form a trench having a base spaced from the upper surface. The laser is controlled to contour a wall of the trench to a predetermined profile, such as a ramp.

A membrane probe can thus be formed on a flexible polymer membrane of predetermined thickness having planar parallel upper and lower surfaces, with a plurality of contact bumps protruding from a central area of the lower surface and a conductive ground plane covering a portion of the lower surface surrounding the central area. Conductive line traces on the upper surface extending inward from a periphery of the membrane to said central area, including line traces electrically connected to the contact bumps, can have a portion recessed into a trench in the upper surface of the membrane. The recessed portion can contact a ground plane or other conductive layer on a lower side of the member, or can be spaced from the conductive layer by a predetermined dielectric thickness determined by the depth of the trench to form a distributed capacitor.

The foregoing and other objects, features and advantages of the invention will become more readily apparent from the following detailed description of a preferred embodiment which proceeds with reference to the drawings.

DETAILED DESCRIPTION

Figure 1:
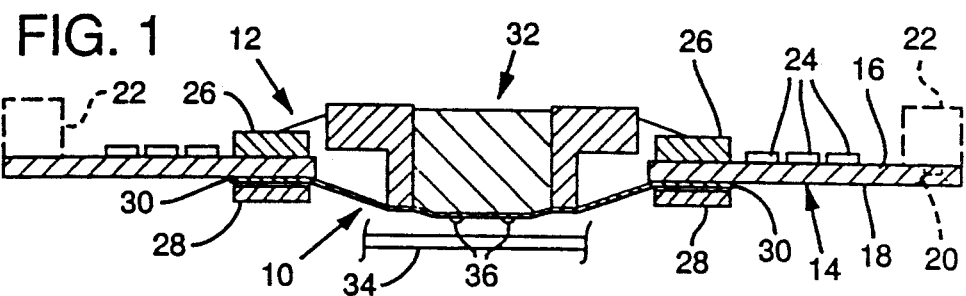
FIG. 1 is a cross-sectional view of a membrane probe card having a membrane probe mounted in position for testing an IC wafer or other DUT.

Referring to FIG. 1, a circular membrane probe 10 is mounted for use in a probe card 12. The probe card includes an annular, multi-layer printed circuit board-type carrier 14 having an upper surface 16 and a lower surface 18. The outer periphery of the carrier is inletted with screw holes 20 for mounting the carrier on an annular interface ring 22. Terminations and bypasses and other circuit elements 24 may be formed on the upper surface of the carrier.

Upper and lower annular mounting rings 26, 28 are bolted to opposite sides of carrier 14 along the interior periphery thereof. A circumferential margin 30 of the membrane probe 10 is secured in contact with the lower surface 18 of carrier 14 by the lower ring 20. An annular force delivery mechanism 32 is mounted centrally within the upper mounting ring 26. A central circular opening (not shown) in mechanism 32 is transparent, as is a central rectangular opening in membrane probe 10, to permit alignment of the probe to the device under test (DUT), such as a die on wafer 34. The wafer is supported on a platform (not shown) which is raised and lowered so that the upper surface of the wafer can contact the membrane probe. The membrane probe is contacted on its upper surface and stretched taut by the force delivery mechanism 32 so as to protrude contact bumps 36 on the lower side thereof downward into contact with the wafer surface.

Figure 2:
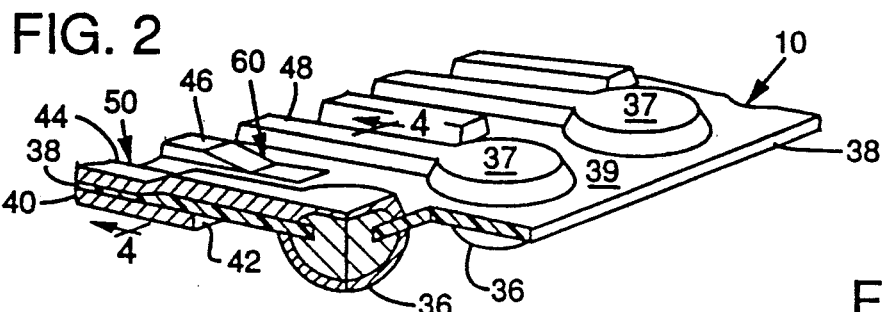
FIG. 2 is an enlarged sectional/perspective view of a portion of a membrane probe in accordance with the invention.

FIG. 2 shows in perspective a section of the membrane probe 10 embodying a distributed capacitance line trace and a line trace-to-ground plane contact in accordance with the invention.

The membrane probe 10 is formed on a thin (e.g., 25 $\mu$m.) circular, polyimide (or other polymer) membrane 38 having a planar upper surface 39 and a parallel lower surface. The lower surface of membrane 38 is coated with a thin (9-18 $\mu$m.) plated or foil metal (e.g., copper) layer 40. A rectangular window 42 is formed in the metal layer 40 in a central region of membrane probe 10 encompassing contact bumps 36. A set of parallel transmission line traces 44, 46, 48 extend toward the center of the membrane probe from the periphery thereof, where contact is made to circuitry on the multi-layer carrier 14.

Conventionally, all of these traces would be formed by patterning a thin (e.g., 18 $\mu$m.) copper foil layer applied to the planar upper surface 39 of membrane 38. The contact bumps are conventionally formed by nickel plating through circular VIAs to circular terminals 37 of selected line traces. Optionally, the contact bumps are coated with a thin layer of aluminum, platinum or gold.

Figures 3, 4:
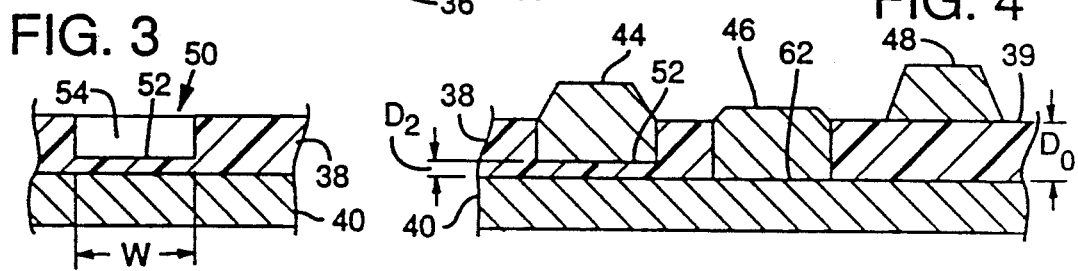
FIGS. 3 and 4 are cross-sectional views taken along lines 4—4 in FIG. 2 illustrating successive steps in the method according to the invention of fabrication of forming transmission line traces at different depths in the membrane dielectric layer.
Figures 5, 6:
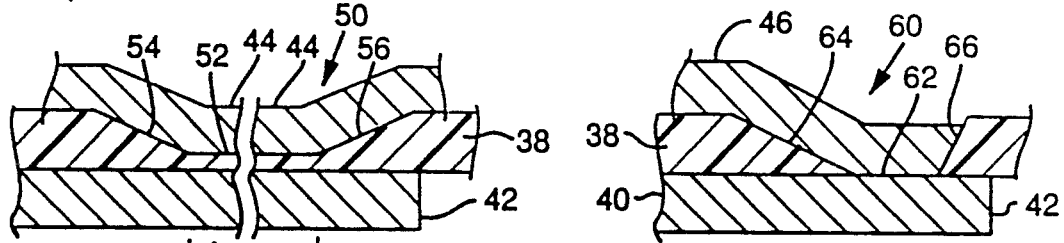
FIG. 5 is a longitudinal sectional view of the membrane probe of FIG. 4 probe showing an increased capacitance line trace in accordance with the invention.
FIG. 6 is a view similar to FIG. 5 showing a line trace shorted to the ground plane through a ramped VIA in accordance with the invention.

In accordance with the invention, the upper surface 39 of membrane 38 is selectively contoured during fabrication of the membrane probe to terminate some traces and to modify the capacitance of other traces. As shown in FIG. 2 and FIGS. 4 and 5, trace 44 is fabricated with an increased capacitance while trace 48 is made with a normal or minimum capacitance. Also, as shown in FIG. 2 and FIGS. 4 and 6, trace 46 is shown terminated to the ground plane 40.

Referring to FIGS. 3, 4 and 5, a lengthwise portion L of trace 44 is formed in a channel or trench 50 having a base 52 of width W and length L and opposite ramped ends 54, 56. Then, metal or other conductive material is deposited over the surface of the membrane 38, including in the trench, and patterned to form the line traces. The preferred technique used to form and pattern the metal line traces is to sputter-deposit the metal over the membrane surface, mask the pattern of the traces, and etch away undesired areas of metal. Alternatively, a negative deposition technique can be used, in which the membrane surface is first masked, a seed layer is deposited over the areas in which the traces are to be formed, including within the recesses, and then the remainder of thickness of the traces is built up by electroplating.

Both techniques use line-of-sight deposition, in which an adatom flux of source material is directed at the substrate surface on which the material to be deposited at an angle approximately normal to the surface. Such techniques ordinarily cannot deposit material effectively on surfaces parallel or nearly parallel to the direction of deposition. Hence, the importance of structuring the trench so that deposited metal (or a seed layer) are applied reliably to the surface on which the line traces are to be formed. This is accomplished by forming the trenches with end walls, over which line trace continuity must be assured, that are ramped at a slope sufficient to be coated by a line-of-sight deposition technique. The slope of such end walls should be less than about 45° and preferably less than about 30°.

To increase the distributed capacitance along length L of trace 44, the trench base 52 is recessed in the upper surface sufficiently to space line trace 44 a predetermined distance $D_2$ from ground plane 40. Trace 48 is not recessed into the membrane 38 and so is spaced from the ground plane 40 by a distance $D_0$. The recess defines a dielectric thickness $D_2$ which is less than the original dielectric thickness $D_0$ of the membrane 38. For traces 44 and 48 of equal width, the ratio of capacitances of portions of traces 44 and 48 of equal lengths is proportional to the ratio $D_0$ divided by $D_2$, ignoring edge effects. Thus, if the base 52 of trench 50 is recessed by one-half the thickness of the membrane, then the capacitance of a length of a trace 44 formed in the recess is approximately twice that of a corresponding length and width of a trace 48 formed atop the upper membrane surface 39. Besides varying the dielectric thickness $D_2$, capacitance can also be controlled by varying the length L of the trench.

Figures 7, 8:
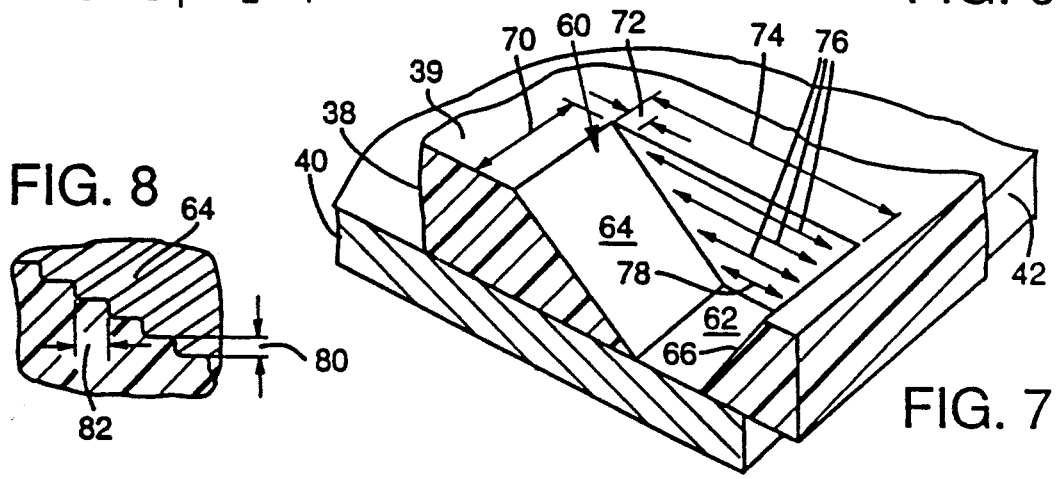
FIG. 7 is a perspective view illustrating the method of the invention as used to form a VIA through the membrane dielectric layer to short a line trace to a ground plane on the opposite side of the membrane.
FIG. 8 is an enlarged view of a portion of FIG. 7 detailing the profile of the ramped end wall.

Referring to FIGS. 6 and 7, a line trace such as trace 46 can be terminated by contact to the ground plane. A trench 60 is formed at the desired location of termination with a base 62 at which the upper surface of ground plane 40 is exposed, and opposite ramped ends 64, 66. End 64, over which continuity of the trace is important, should have a slope of less than about 60°, preferably of 45°. End 66 can have a steeper slope because line trace 46 terminates at that location. The trench 60 is relatively short, for example, 100 $\mu$m. at surface 39 and about 20 $\mu$m. at its base 62. The line trace 46, including the portion in trench 60 contacting the ground plane at base 62, is formed in the same manner and preferably in the same operations as line trace 44.

FIG. 7 also illustrates the manner in which the trenches 50, 60 are formed, as next explained. The trenches are formed using an excimer laser, the beam of which is swept back and forth over an area of the membrane 38 to be recessed. Preferably, the laser has a slotted beam having a dimension 70 which defines the width W of the trench and a dimension 72 aligned in the direction of the length L of the trench. For example, dimension 70 is 30 $\mu$m. and dimension 72 is 5 $\mu$m.

In general, the beam is swept back and forth in sweeps 74, 76, 78 of progressively decreasing length. The last, shortest sweep 78 defines the length L of the bottom of the trench. The first, longest sweep 74 has a length (for example, 100 $\mu$m. in contact trench 60) that is determined by the length L, the slopes of ends 64, 66 and the depth of the trench.

Referring to FIG. 8, the slope and smoothness of the ramped ends are defined in incremental steps by the incremental thickness 80 of membrane material removed during each sweep (preferably 1-2 $\mu$m.) and the change in length or offset 82 of each successive sweep. For a beam dimension 72 of 5 μm. and an etch thickness 80 or ablation rate of 1.6 μm. per sweep, an offset 82 of 2 μm. has proven suitable. This offset can be divided equally between both ends to form ramps of equal slope, as in the case of ends 54, 56 (FIG. 5) or skewed to form ramps of unequal length as in the case of ends 62, 64 (FIG. 6). An offset of 2 μm. provides an overlap of 3 μm. at the preferred laser sweep rate of 300 μm./sec and pulsed frequency of 100 Hz. The ablation rate depends on the laser energy and pulse rate. The laser is selected to provide an energy sufficient to provide bond dissociation for the material used in the membrane 38. For polyimide, these energies range from 3.6 eV (C-C) to 8 eV (C-N).

For lasers of a wavelength >351 nm. the photon energy is adsorbed as vibrational excitation, generating heat which "boils" the material out. This is thermal removal, which is difficult to localize. For excimer lasers having a wavelength <351 nm., energy is provided in excess of that needed to produce bond dissociation. The excess energy appears as heat or kinetic energy of the byproducts. Removal of material in this instance involves both thermal and ablation components. Another thermal effect is reflow or crosslinking of the polymer material, which interferes with ablation. Hence, thermal effects should be minimized during etching in this process.

To avoid thermal effects, prior researchers in the use of excimer lasers slow the laser down. Most used are 249 nm. lasers operated at low pulse frequencies: 3 Hz. 2 Hz. and less. This is not acceptable for production, which requires greater throughput, and the present invention is best performed with different etch depths. Large pulse energies (2-10 J./cm$^2$) produce large steps/pulse. Smaller, smooth steps are needed for continuity of metallization. Another limitation is that the energy level must not melt the ground plane metal. For copper, this was found to begin at above about 0.54 J./cm$^2$ and sets an upper limit of operation at 0.72 J./cm$^2$.

The preferred laser for use in the present invention is one with a wavelength of 308 nm. and which produces an energy level of about 4.0 eV. The preferred operational window (in energy) was experimentally found to be between 0.18 J./cm$^2$ and 0.35 J./cm$^2$ at 100 Hz pulse frequency, for polyimide. The optimum energy and pulse frequency operating ranges need to be determined for each material. The addition of oxygen improves the ablation process and widens the optimum window of operation. It is preferred to flood the locality of ablation with oxygen (O$_2$) while etching polymer material. Once the metal ground plane is reached, however, it is preferred to change to flooding the locality with nitrogen (N$_2$) to keep from oxidizing the metal surface. The foregoing operational parameters and sequence of operation to form capacitive line trace trenches 50, trenches for through-VIAS 60, and other recessed patterns as may be useful in polymer substrates are preferably computer controlled.

A second technique can be used to obtain smooth steps as an alternative to ablating progressively shorter trenches. This technique includes ablating coincident shallow squares (or circles) and then smoothing the steps by defocusing the laser. The latter step lowers the energy density and causes reflowing of polymer material without further oblation. This technique could allow faster removal rates (deeper steps) or customizing the profile.

Having illustrated and described the principles of our invention in a preferred embodiment and examples thereof, it should be readily apparent to those skilled in the art that the invention can be modified in arrangement, detail and application without departing from such principles. We claim all modifications coming within the spirit and scope of the accompanying claims.

We claim:

1. A method of forming a circuit conductor on an upper surface of a polymer substrate, the method comprising:
    forming a trench in the substrate having a base spaced a predetermined distance below the substrate upper surface;
    contouring the trench to include at least one lengthwise end wall defining a ramp extending at an obtuse angle between the substrate upper surface and the base of the trench; and
    depositing and patterning an upper conductive layer to form a line trace including portions extending lengthwise continuously over a portion of the substrate upper surface, down the ramped end wall and along the base of the trench.

2. A method according to claim 1 in which the trench is formed and contoured by successively removing incremental thicknesses of polymer material of depthwise decreasing length from a predetermined length and width of the substrate.

3. A method according to claim 2 in which the incremental thicknesses of material removed are dimensioned so that step-coverage of the conductive layer deposited in the ramp is continuous.

4. A method according to claim 3 in which the incremental thicknesses are less than 2 μm.

5. A method according to claim 2 in which removal is performed by laser etching the polymer material in sweeps of depthwise decreasing length down to said predetermined depth from the substrate upper surface.

6. A method according to claim 5 in which laser etching includes selecting and operating an excimer at a wavelength, energy density and pulse rate such that the principal polymer removal mechanism is ablation.

7. A method according to claim 1 in which the conductive layer is deposited at least in part by line-of-sight deposition such that an adatom flux of conductive material is approximately normal to the substrate upper surface, the ramped end wall being formed at an angle such that the conductive material deposited thereon is electrically continuous with the line trace deposited on the substrate upper surface.

8. A method according to claim 1 in which the ramped end wall forms an angle of less than 60° from the substrate upper surface.

9. A method according to claim 1 in which the polymer substrate has a predetermined first thickness and includes a lower surface having a lower conductive layer formed thereon, the method further including forming said trench with a predetermined length defined by opposite ones of said ramped end walls and a depth such that the base of the trench and a portion of the upper conductive layer deposited thereon are spaced from the lower conductive layer by a second thickness defining a dielectric spacing for capacitive coupling therebetween.

10. A method according to claim 1 in which the polymer substrate has a predetermined first thickness and includes a lower surface having a lower conductive layer formed thereon, the method further including forming said trench with a depth equal to said first thickness to expose an upper surface of the lower conductive layer in the base of the trench so that a portion of the upper conductive layer deposited in the trench electrically contacts the lower conductive layer.

11. A method of laser-etching a surface of a flexible circuit substrate, the method comprising:

providing a flexible polymer sheet substrate having planar, parallel upper and lower surfaces and a predetermined first thickness;

selecting and operating an excimer laser at a wavelength and energy density such that directing a beam from the laser at the upper surface of the substrate removes by ablation a predetermined incremental thickness of polymer material to form a trench having a base spaced from the upper surface; and controlling the laser to contour a wall of the trench to a predetermined profile.

12. A method according to claim 11 including depositing and patterning a conductive layer on the upper surface and the base and wall of the trench, the wall being contoured to a profile such that the conductive layer is deposited contiguously thereon.

13. A method according to claim 12 in which the profile includes a ramp.

14. A method according to claim 11 in which the laser wavelength is about 308 nm.

15. A method according to claim 11 in which the energy density is less than 0.72 J./cm$^2$.

16. A method according to claim 11 in which the laser is operated at about 100 Hz pulse frequency.

17. A method according to claim 11 in which the substrate lower surface includes a metal layer, the trench is formed to a depth sufficient to expose the metal layer, and the energy density is below a density at which the metal would melt.

18. A method according to claim 11 in which the laser is controlled to produce an energy density less than 0.54 J./cm$^2$ and a pulse frequency of at least 70 Hz.

19. A method according to claim 11 in which the laser beam has a predetermined size and is swept back and forth over an area of the substrate in sweeps of successively decreasing length.

20. A method according to claim 19 in which the sweep rate is less than the product of pulse frequency and a dimension of the beam in the direction in which the beam is swept.

21. A method according to claim 20 in which the sweep rate equals the product of pulse frequency and the difference between said beam dimension and an incremental change in successive sweep length.

22. A method according to claim 11 in which the polymer material is polyimide, the laser energy density is in a range of 0.18 J./cm$^2$ to 0.35 J./cm$^2$, and the pulse frequency is about 100 Hz.

23. A method according to claim 11 including flooding the locality of ablation of polymer material with oxygen.

24. A method according to claim 23 in which the substrate lower surface includes a metal layer, the trench is formed to a depth sufficient to expose the metal layer, including flooding the base of the trench with nitrogen as the metal layer is exposed to minimize oxidation thereof.

25. A method according to claim 11 in which controlling the laser includes defocusing the laser beam.

* * * * *